US011626445B2

(12) United States Patent
Beuville et al.

(10) Patent No.: US 11,626,445 B2
(45) Date of Patent: Apr. 11, 2023

(54) PER-PIXEL DETECTOR BIAS CONTROL

(71) Applicant: RAYTHEON COMPANY, Waltham, MA (US)

(72) Inventors: Eric J. Beuville, Goleta, CA (US); Micky Harris, Lompoc, CA (US); Ryan Boesch, Goleta, CA (US); Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 12 days.

(21) Appl. No.: 16/549,069

(22) Filed: Aug. 23, 2019

(65) Prior Publication Data

US 2020/0066781 A1 Feb. 27, 2020

Related U.S. Application Data

(60) Provisional application No. 62/721,695, filed on Aug. 23, 2018.

(51) Int. Cl.
*H01L 27/146* (2006.01)
*H04N 5/359* (2011.01)
*H01L 27/148* (2006.01)

(52) U.S. Cl.
CPC ...... *H01L 27/14643* (2013.01); *H01L 27/148* (2013.01); *H04N 5/359* (2013.01)

(58) Field of Classification Search
CPC ........................ H01L 27/14643; H04N 5/359
See application file for complete search history.

(56) References Cited

U.S. PATENT DOCUMENTS

| 5,774,400 | A | 6/1998 | Lancaster et al. |
| 7,898,852 | B1 * | 3/2011 | Levy ................. H01L 29/42324 |
| | | | 365/185.03 |
| 8,766,272 | B2 | 7/2014 | Yu et al. |
| 9,082,673 | B2 | 7/2015 | Yu et al. |

(Continued)

FOREIGN PATENT DOCUMENTS

| WO | 2016038986 A1 | 3/2016 |
| WO | 2020041651 A1 | 2/2020 |

OTHER PUBLICATIONS

Notification of Transmittal of the International Search Report of the International Searching Authority, or the Declaration; PCT/US2019/047810; dated Oct. 16, 2019, 18 pages.
Notification of Transmittal of the Written Opinion of the International Searching Authority; PCT/US2019/047810; dated Oct. 16, 2019, 11 pages.
Mead, et al. "Analog VLSI Implementation of Neural Systems" 1989 by Kluwer Academic Publishers, 249 pages.

(Continued)

*Primary Examiner* — Thanh Luu
(74) *Attorney, Agent, or Firm* — Cantor Colburn LLP

(57) ABSTRACT

A pixel includes a photo-diode, an integration capacitor arranged to receive a photo current from the photo-diode and to store charge developed from the photo current; and an injection transistor disposed between the photo-diode and the integration capacitor that controls flow of the photo current from the photo-diode to the integration capacitor, the injection transistor having a gate, a source electrically coupled to the photo-diode at a first node, and a drain electrically coupled to the integration capacitor. The injection transistor is a silicon-oxide-nitride-oxide-silicon (SONOS) FET having its gate set to a SONOS gate voltage to control a detector bias voltage of the photo-diode at the first node.

16 Claims, 3 Drawing Sheets

(56) References Cited

U.S. PATENT DOCUMENTS

| | | | |
|---|---|---|---|
| 9,378,821 B1 | 6/2016 | Prabhakar et al. | |
| 2009/0086538 A1* | 4/2009 | Jenne | G11C 16/0466 365/185.02 |
| 2009/0121139 A1 | 5/2009 | Chammings | |
| 2010/0117138 A1 | 5/2010 | Huerta et al. | |
| 2013/0193307 A1* | 8/2013 | Sander | H04N 5/361 250/208.1 |
| 2013/0252559 A1 | 9/2013 | Deguch et al. | |
| 2013/0277561 A1* | 10/2013 | Woolaway | H04N 5/3698 250/340 |
| 2016/0088243 A1* | 3/2016 | Higashi | H01L 27/14612 348/294 |
| 2021/0183925 A1* | 6/2021 | Shukuri | H04N 5/37455 |
| 2021/0381888 A1 | 12/2021 | Beuville et al. | |

OTHER PUBLICATIONS

Notification of Transmittal of the International Preliminary Report on Patentability of the International Searching Authority, or the Declaration; PCT/US2019/047810; dated Mar. 4, 2021, 11 pages.

Shibata, et al. "A Functional MOS Transistor Featuring Gate-Level Weighted Sum and Threshold Operations", IEEE Transactions on Electron Devices, vol. 39, No. 6, Jun. 1992, 12 pages.

U.S. Corrected Notice of Allowability for U.S. Appl. No. 16/892,430 dated Feb. 18, 2022, 4 pages.

U.S. Notice of Allowance for U.S. Appl. No. 16/892,430 dated Feb. 8, 2022, 16 pages.

Yang, et al. "Multiple Input Floating-Gate MOS Differential Amplifiers and Applications for Analog Computation" Proceedings of 36th Midwest Symposium on Circuits and Systems, IEEE, Date of Conference: Aug. 16-18, 1993, 5 pages.

* cited by examiner

PER-PIXEL DETECTOR BIAS CONTROL

CROSS REFERENCE TO RELATED APPLICATIONS

This application claims the benefit of an earlier filing date from U.S. Provisional Application Ser. No. 62/721,695 filed Aug. 23, 2018, the entire disclosure of which is incorporated herein by reference.

BACKGROUND

The present disclosure relates to a digital pixel imager and, in particular, a digital pixel circuit that includes a per-pixel bias control.

In legacy analog imagers, particularly infrared imagers, photo-current from a detector diode is integrated by a well or integration capacitor coupled to the detector diode, and then once per video frame, the voltage or charge of the well capacitor is transferred to a down-stream analog-to-digital converter (ADC), where the voltage is converted to a binary value.

One type of in-pixel ADC circuit utilizes a direct injection (DI) transistor. In such a circuit charge from a photo-diode is accumulated over an integration capacitor. Charge is accumulated, in general, until a readout time. When that time is reached, the charge stored in integration capacitor is provided to a readout circuit. Such circuits can either integrate then read or read while integrating circuits.

Control of the flow of current from the photo-diode is controlled by an injection transistor. The gate of the injection transistor is coupled to a bias voltage. The level of this voltage can be selected by the skilled artisan and is used, in part, to keep the photo-diode in reverse bias.

However, in some cases detector bias non-uniformity affects the overall performance and yield (pixels not meeting performance) of an imaging array.

SUMMARY

According to one embodiment, a pixel includes a photo-diode, an integration capacitor arranged to receive a photo current from the photo-diode and to store charge developed from the photo current; and an injection transistor disposed between the photo-diode and the integration capacitor that controls flow of the photo current from the photo-diode to the integration capacitor, the injection transistor having a gate, a source electrically coupled to the photo-diode at a first node, and a drain electrically coupled to the integration capacitor. The injection transistor is a silicon-oxide-nitride-oxide-silicon (SONOS) FET having its gate set to a SONOS gate voltage to control a detector bias voltage of the photo-diode at the first node.

According to another embodiment, a pixel that includes a photo-diode; an integration capacitor arranged to receive a current from the photo-diode and to store charge developed from the current; and a silicon-oxide-nitride-oxide-silicon (SONOS) field-effect transistor (FET) disposed between the photodiode and the integration capacitor is disclosed. The SONOS FET is configured to control a detector bias voltage of the photo-diode In a pixel of any prior embodiment, the detector bias voltage at the first node is equal to: $V_{DETBIAS} = V_{dd} - (V_{TSONOS} - V_{GS})$, where $V_{GS}$ is the gate to source voltage of the injection transistor, $V_{TSONOS}$ is the SONOS gate voltage, and $V_{dd}$ is a voltage applied on a side of the photo-diode opposite the first node.

In one embodiment, in a pixel of any prior embodiment, the gate is formed of a gate stack that includes a layer of silicon nitride that stores current to set the SONOS gate voltage.

In one embodiment, in a pixel of any prior embodiment, the layer of silicon nitride is formed of $Si_3N_4$ or $Si_9N_{10}$.

In one embodiment, a pixel of any prior embodiment, further includes a reset switch coupled in parallel with the integration capacitor.

In one embodiment, in a pixel of any prior embodiment, the SONOS FET comprises a gate, a source electrically coupled to the photodiode at a first node, and a drain electrically coupled to the integration capacitor, wherein the gate is set to a SONOS gate voltage to control the detector bias voltage of the photodiode at the first node.

In one embodiment a method of operating a pixel is disclosed. The method includes coupling a photo-diode to a source of an injection transistor, wherein the injection transistor is a silicon-oxide-nitride-oxide-silicon (SONOS) FET; coupling an integration capacitor to a drain of the injection transistor such that the integration capacitor can receive a photo current from the photo-diode and store charge developed from the photo current; and setting a SONOS gate voltage on the injection transistor to control a detector bias voltage of the photo-diode at a first node disposed between the photo-diode and the integration capacitor.

According to a method of any prior embodiment, the detector bias voltage at the first node is equal to: $V_{DETBIAS} = V_{dd} - (V_{TSONOS} - V_{GS})$, where $V_{GS}$ is the gate to source voltage of the injection transistor, $V_{TSONOS}$ is the SONOS gate voltage, and $V_{dd}$ is a voltage applied on a side of the photo-diode opposite the first node.

According to a method of any prior embodiment, the gate is formed of a gate stack that includes a layer of silicon nitride that stores current to set the SONOS gate voltage.

According to a method of any prior embodiment, the layer of silicon nitride is formed of $Si_3N_4$ or $Si_9N_{10}$.

According to a method of any prior embodiment, setting the SONOS gate voltage includes providing a pulse to the gate of the injection transistor, wherein the length of pulse is proportional to the level of the SONOS gate voltage.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
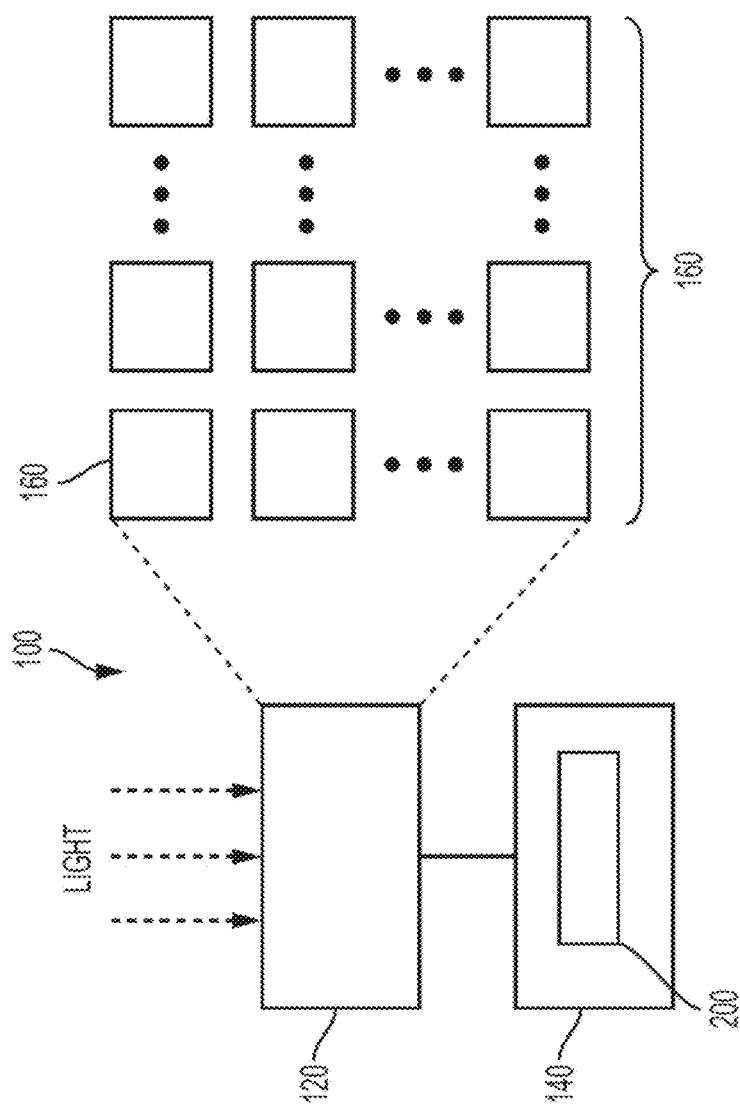
FIG. 1 is a schematic diagram illustrating image detector in accordance with embodiments.

FIG. 1 is a schematic diagram illustrating an image detector 100 in accordance with embodiments. Such a detector 100 may be deployed, for example, on a satellite or other airborne apparatus such as an aircraft or any land- or sea-based tactical application in which it is a requirement that frame rate not be limited by array size. Image detector 100 may be a focal plane array (FPA), active pixel sensor (APS) or any other suitable energy wavelength sensing device. The image detector 100 may be used as a component of a photographic and/or image capturing device, such as a digital camera, video camera or other similar device. The image detector 100 may include a detection device 120 and an analog-to-digital converter (ADC) 140.

The detection device 120 includes an array of photosensitive/energy wavelength sensitive detector unit cells 160 arranged in an X×Y matrix. Each of the detector unit cells 160 may accumulate charge or produce a current and/or voltage in response to light incident upon the detector unit cell 160 and may correspond to a pixel in a captured electronic image. One or more of the detector unit cells 160 may include a photovoltaic detector (e.g., a photovoltaic single absorber detector or a photovoltaic multi-absorber (multi-junction) detector), a barrier device detector, a position sensitive detector (PSD) or other suitable detector.

The ADC 140 may be used for processing of the incident light (e.g., to create an image representative of the incident light). For example, the ADC 140 interfaces with the detection device 120 to receive a signal, such as the accumulated charge or the current and/or voltage produced in response to light incident upon the detector unit cells 160. In one embodiment, the ADC 140 includes a read out integrated circuit (ROIC) 200 that accumulates voltage/current and produces a digital output.

The ADC 140 may include an array of ADC unit cells that are arranged in an X×Y matrix corresponding to the orientation of the X×Y matrix of the detector unit cells 160. Thus, each ADC unit cell may be interconnected with a corresponding detector unit cell 160 by way of one or more direct bond interconnects, such as direct metal-to-metal interconnects or indium interconnects. Each detector unit cell can also be referred to as pixel herein.

In such systems and as generally described above, it is known to utilize an injection transistor to place a diode in the detector unit cell into reverse bias so that it will generate current when exposed to light. In such a systems a generally universal voltage is applied to the gate of all of the injection transistors to achieve the reverse bias. However, given variations in both detector and the injections transistors, various cells in a particular array may be unusable when such universal gate bias voltage is applied. For example, in some cases, a particular diode may produce too much so-called "dark current" when the gate of its associated injection transistor is coupled to the universal gate bias voltage. The dark current may be so great that it makes any measurement from the diode unusable and, as such, makes the particular diode unusable. Similar problems may also exist when due to signal droop causes the voltage applied to a gate of a particular injection transistor results in a lower than desired bias voltage being applied to the diode. Still further, variations in the injection transistors themselves can have negative effects. Herein is disclosed a system where each pixel includes an injection transistor in form of a silicon-oxide-nitride-oxide-silicon (SONOS) FET that can be individually programmed so that a particular diode can operate in a useable manner. This can alleviate problems due to variations in a universal gate voltages across an array and address the variations in individual diodes or transistors or both.

Figure 2:
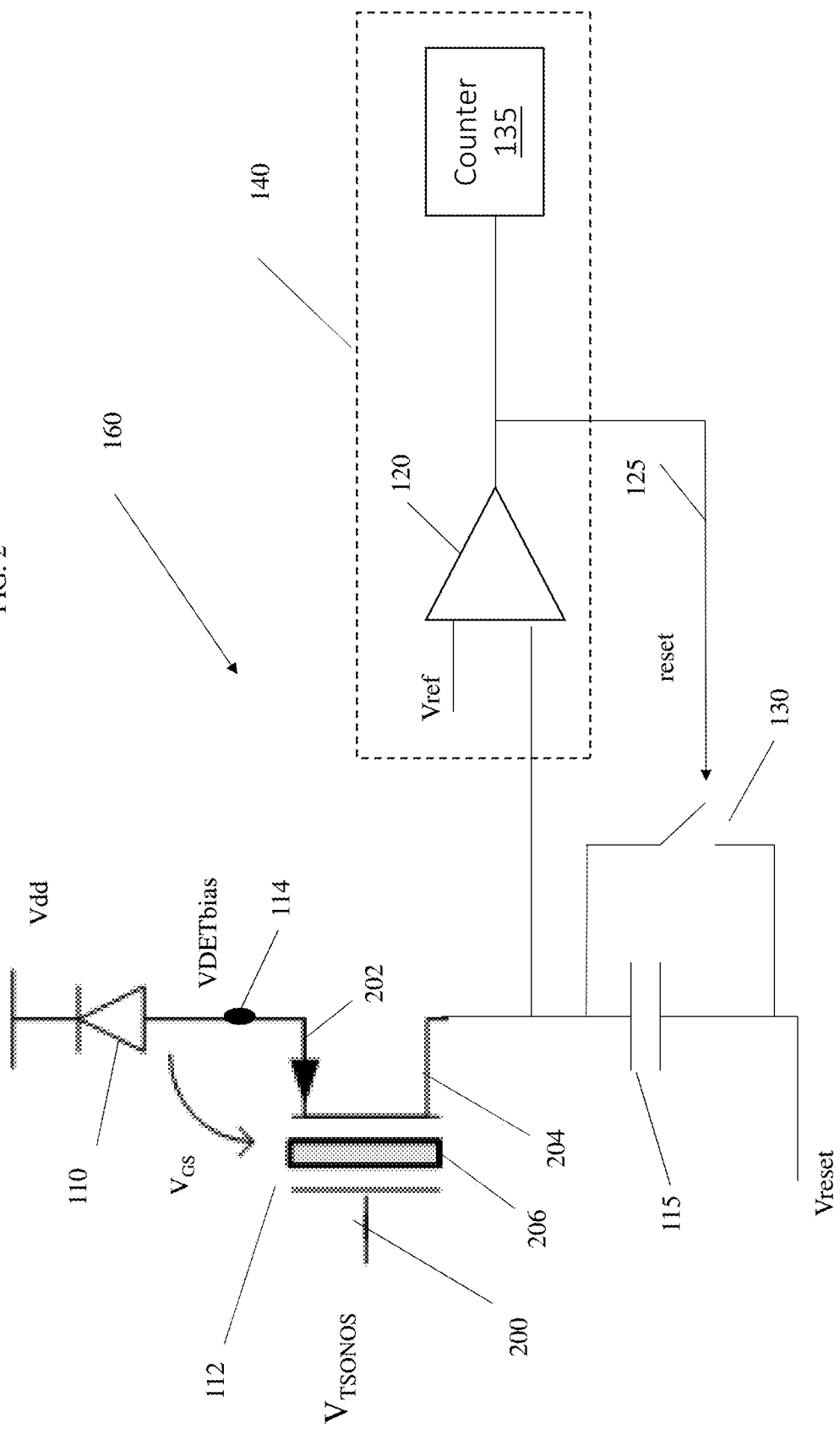
FIG. 2 is a schematic diagram illustrating a unit cell of FIG. 1 that includes a SONOS injection transistor.

FIG. 2 shows a pixel 160 according to one embodiment and includes a photo-diode 110. The pixel 160 includes an input node 114, an SONOS injection transistor 112, an integration capacitor 115, and a reset switch 130. Charge from the photo-diode 110 is accumulated over the integration capacitor 115. Charge is accumulated, in general, until a readout time. When that time is reached, the charge stored in integration capacitor 115 is provided to ADC 140. Then, the capacitor 115 can be reset by closing the reset switch 130 upon receipt of a reset signal 125.

In one embodiment, the ADC 140 is connected to the pixel 160 to create a so-called "digital pixel." In such a case, the ADC 140 can include a comparator 120 that compares the charge on the capacitor 115 to a threshold voltage (Vref). When the voltage across the integration capacitor 115 (referred to as Vint herein) exceeds Vref, the pixel 160 is reset via the reset switch 130 that receives the reset signal 125. During a reset, a voltage equal to the difference between Vref and Vreset is subtracted from the integration capacitor 115. Of course, this is but one example and not meant as limiting. That is, the disclosure herein can be applied to digital and non-digital pixels.

In the case of a digital pixel, each reset event is accumulated (counted) with a digital counter circuit 135. At each frame, a "snapshot" of the contents of the digital counter circuit 135 is copied into a register or memory and read out, line by line. This digital counter circuit 135 operates to exponentially increase the well capacity $Q_{INT}$ of the integration capacitor 115 by a factor of $2^N$, where N is the size of the digital counter circuit 135. Thus, by conserving the photo-charge relationship within a frame period, this type of pixel 160 may achieve improved signal-to-noise ratio.

After the integration time expires, any residual charge accumulated on the integration capacitor 115 can be read out by, for example, a single slope ADC or any other type of ADC (not shown). Of course, when the pixel is not a digital pixel, rather than counting times a comparator exceeds a threshold, all accumulated charge in a frame is read out by the ADC.

As in prior systems, control of the flow of current from the photo-diode 110 is controlled by the SONOS injection transistor 112. Similar to the prior art, the gate of the SONOS injection transistor 112 is coupled to a bias voltage (Vbias). The level of this voltage is selected, in part, to keep the photo-diode 110 in reverse bias. In such a reverse bias configuration, the photo-diode 110 will produce current for two reasons. The first is so called dark current and the other is due to light being absorbed by the diode 110. As discussed above, the range of reverse bias for a diode to perform satisfactorily can vary from diode to diode and can be quite narrow in some instances and different voltages may need to be applied to the gate of SONOS transistors for the diode to operate in a manner that it can produce usable results.

In prior systems an nFET or a pFE was typically used as the injection transistor. In such systems, the gate of the injection transistor was typically connected to an injection transistor voltage ($V_{DI}$) and a global $V_{DI}$ was applied to to the gates of each direct injection transistor in the array. Accordingly, in a typical pixel, the detector bias voltage can be controlled by the gate voltage ($V_{DI}$) as follow:

$$V_{DETBIAS} = V_{dd} - (V_{DI} - V_{GS});$$

where $V_{GS}$ is the gate to source voltage of the FET.

However, detector non-uniformity (sensor response, noise, leakage) as well as non-uniformity of the global bias circuitry that supplies $V_{DI}$ (transistor matching, $V_{DI}$ supply voltage droop, etc.) across the array can affect the overall performance and yield (pixels not meeting performance) of the imaging array.

Of course, there are ways to apply non-uniformity correction (NUC) to the output of the pixel but that require significant processing power and introduce latency in image formation. Some attempts to remove detector and circuitry non-uniformity. For example, an N bit digital-to-analog converter implemented at the pixel level has been proposed but can take significant space in the unit cell layout. Another approach is to sample $V_{bias}$ on a capacitor but this can increase circuit noise.

Herein, to remove the effects the above described non-uniformities, the typical injection transistor can be replaced with the illustrated SONOS (silicon-oxide-nitride-oxide-silicon) FET 112. The SONOS FET 112 includes a gate 200, a source 202 and a drain 204. The SONOS FET 112 includes a layer of silicon nitride 206 disposed therein in the gate stack. The layer of silicon nitride 206 can be one of: $Si_3N_4$ or $Si_9N_{10}$. The SONOS FET for each photodiode can be set individually to account for variations in the performance of each photodiode and the SONOS FET 112 itself.

The source 202 of the SONOS FET 112 is electrically connected to the photodiode 110 at node 114 and the drain 204 is electrically connected to the integration capacitor 115. As shown, the connections at the source 202 and drain 204 are direct connections but this is not required unless specifically recited.

In operation, a voltage can be stored on the gate 200 of the SONOS FET 112. This stored voltage can set the bias of the diode of discussed more fully below. In more detail, one or more of the gates of the SONOS FETs 112 across an array can each have a bias in the gate 200 that is held in the silicon nitride layer 206. Once stored, this value can held indefinitely and serves to raise the voltage at which the SONOS FET 112 will conduct. That is, the stored voltage will keep node 114 at level that allows for a particular diode to produce a useable output. As such, the bias circuitry non-uniformities as well as the diode and injection transistor non-uniformities mentioned above can be removed as each cell can be programmed to the desired bias voltage level. The overall imaging performance and yield can be improved.

In more detail, the voltage stored on the gate 200 of the SONOS FET 112 can be referred to herein as $V_{TSONOS}$. Accordingly, the detector bias voltage $V_{DETBIAS}$ at node 114 can be represented by:

$$V_{DETBIAS}=V_{dd}-(V_{TSONOS}-V_{GS}).$$

Figure 3:
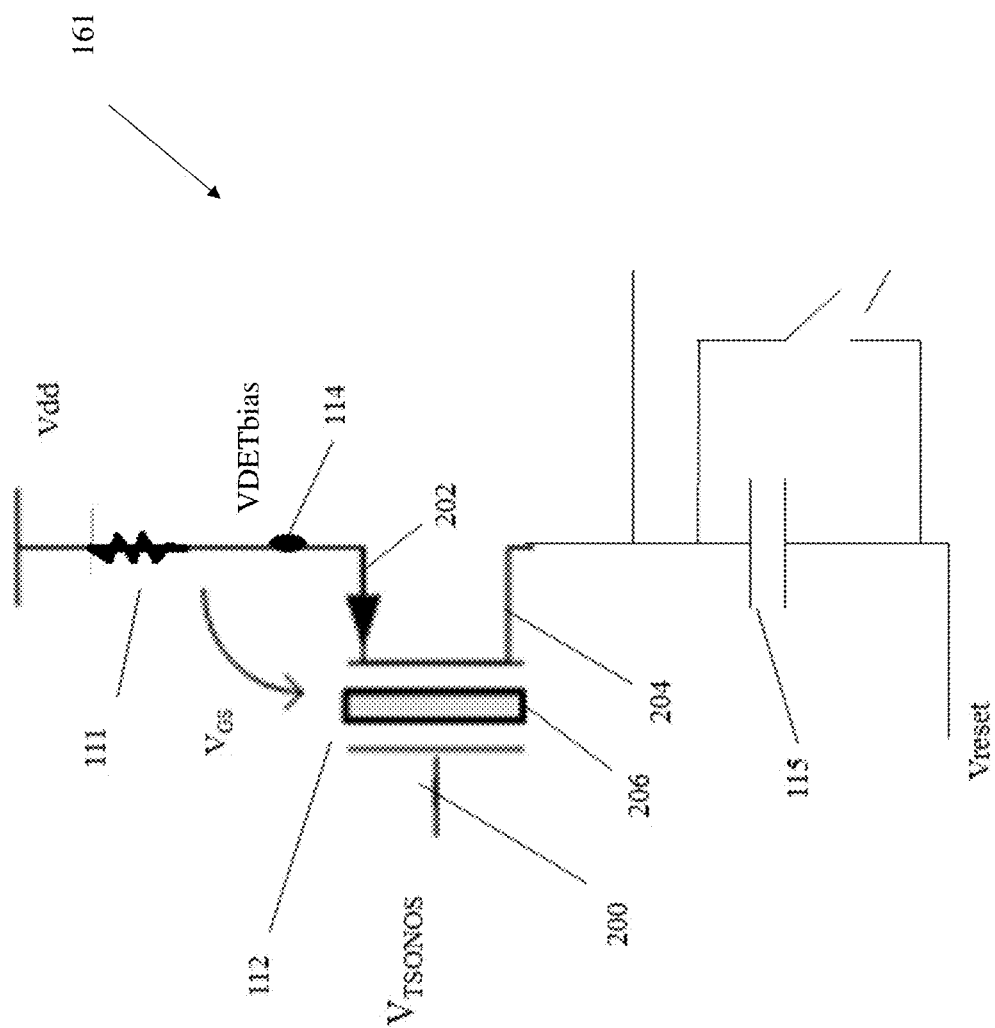
FIG. 3 is graph showing an example of pulse width applied to set the gate bias of the injection transistor.

It shall be understood by the skilled artisan that $V_{GS}$ will be unique for each FET. As shown by trace 302 in FIG. 3, when a pulse is applied to the gate 200, the duration of the pulse will set the level of the $V_{TSONOS}$. Similarly, trace 304 shows an example of $V_{TSONOS}$ being reduced. This can be utilized to vary the level of $V_{TSONOS}$ of a particular cell. The value of $V_{TSONOS}$ can be reduced such that its follow trace 304 by application of a negative pulses to the gate of the SONOS transistor 112. In another embodiment, if a new value of $V_{TSONOS}$ is desired, a constant negative bias can be applied to the gate of the the SONOS transistor 112 to erase any prior programming. A new value can then be programmed in the manner described above.

The SONOS FET can store $V_{TSONOS}$ because the gate of the SONOS FET 112 includes a layer of silicon nitride 206. In more detail, in operation, when gate 200 is biased positively, electrons from the transistor source 202 and drain 204 regions tunnel get trapped in the silicon nitride layer 206. This results in an energy barrier between the drain 204 and the source 202, raising the threshold voltage $V_{TSONOS}$ (the gate-source voltage) necessary for current to flow through the FET 112.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A pixel comprising:
   a photo-diode;
   an integration capacitor arranged to receive a photo current from the photo-diode and to store charge developed from the photo current; and
   an injection transistor formed as a silicon-oxide-nitride-oxide-silicon (SONOS) FET coupled to the photo-diode and the integration capacitor and that controls a detector bias of the photo-diode, the injection transistor having a gate, a source electrically coupled to the photo-diode at a first node, and a drain electrically coupled to the integration capacitor;
   wherein the gate is set to a SONOS gate voltage to control the detector bias voltage of the photo-diode at the first node.

2. The pixel of claim 1, wherein the detector bias voltage at the first node is equal to:

$$V_{DETBIAS}=V_{dd}-(V_{TSONOS}-V_{GS});$$

where $V_{GS}$ is the gate to source voltage of the injection transistor, $V_{TSONOS}$ is the SONOS gate voltage, and $V_{dd}$ is a voltage applied on a side of the photo-diode opposite the first node.

3. The pixel of claim 1, wherein the gate is formed of a gate stack that includes a layer of silicon nitride that stores current to set the SONOS gate voltage.

4. The pixel of claim 3, wherein the layer of silicon nitride is formed of $Si_3N_4$ or $Si_9N_{10}$.

5. The pixel of claim 1, further including a reset switch coupled in parallel with the integration capacitor.

6. A method of operating a pixel, the method comprising:
   coupling a photo-diode to a source of an injection transistor, wherein the injection transistor is a silicon-oxide-nitride-oxide-silicon (SONOS) FET;
   coupling an integration capacitor to a drain of the injection transistor such that the integration capacitor can receive a photo current from the photo-diode that passes through the injection transistor and store charge developed from the photo current; and setting a SONOS gate voltage on the injection transistor to control a detector bias voltage of the photo-diode at a first node disposed between the photo-diode and the integration capacitor.

7. The method of claim 6, wherein the detector bias voltage at the first node is equal to:

$$V_{DETBIAS}=V_{dd}-(V_{TSONOS}-V_{GS});$$

where $V_{GS}$ is the gate to source voltage of the injection transistor, $V_{TSONOS}$ is the SONOS gate voltage, and $V_{dd}$ is a voltage applied on a side of the photo-diode opposite the first node.

8. The method of claim 6, wherein the gate is formed of a gate stack that includes a layer of silicon nitride that stores current to set the SONOS gate voltage.

9. The method of claim 8, wherein the layer of silicon nitride is formed of $Si_3N_4$ or $Si_9N_{10}$.

10. The method of claim 6, wherein setting the SONOS gate voltage includes providing a pulse to the gate of the injection transistor, wherein the length of pulse is proportional to the level of the SONOS gate voltage.

11. A pixel comprising:
a photo-diode;
an integration capacitor arranged to receive a current from the photo-diode and to store charge developed from the current; and
a silicon-oxide-nitride-oxide-silicon (SONOS) field-effect transistor (FET) coupled to the the photodiode and to the integration capacitor such that current from the photo-diode passes through the SONOS FET to reach the integration capacitor, wherein the SONOS FET is configured to control a detector bias voltage of the photo-diode.

12. The pixel of claim 11, wherein the SONOS FET comprises a gate, a source electrically coupled to the photodiode at a first node, and a drain electrically coupled to the integration capacitor, wherein the gate is set to a SONOS gate voltage to control the detector bias voltage of the photo-diode at the first node.

13. The pixel of claim 12, wherein the detector bias voltage at the first node is equal to:

$$V_{DETBIAS}=V_{dd}-(V_{TSONOS}-V_{GS});$$

where $V_{GS}$ is the gate to source voltage of the injection transistor, $V_{TSONOS}$ is the SONOS gate voltage, and $V_{dd}$ is a voltage applied on a side of the photo-diode opposite the first node.

14. The pixel of claim 12, wherein the gate is formed of a gate stack that includes a layer of silicon nitride that stores current to set the SONOS gate voltage.

15. The pixel of claim 14, wherein the layer of silicon nitride is formed of $Si_3N_4$ or $Si_9N_{10}$.

16. The pixel of claim 11, further including a reset switch coupled in parallel with the integration capacitor.

* * * * *